(12) United States Patent
Ichinose et al.

(10) Patent No.: US 7,189,636 B2
(45) Date of Patent: Mar. 13, 2007

(54) FABRICATION METHOD OF SEMICONDUCTOR INTEGRATED CIRCUIT DEVICE

(75) Inventors: Kazuhito Ichinose, Sanda (JP); Hidetsugu Ogishi, Hachioji (JP); Ken Okutani, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 16 days.

(21) Appl. No.: 10/733,377

(22) Filed: Dec. 12, 2003

(65) Prior Publication Data

US 2004/0121591 A1 Jun. 24, 2004

(30) Foreign Application Priority Data

Dec. 13, 2002 (JP) .............................. 2002-361700

(51) Int. Cl.
*H01L 21/44* (2006.01)
(52) U.S. Cl. ...................... 438/586; 438/664; 438/683
(58) Field of Classification Search ................ 438/586, 438/643, 649, 653, 655, 664, 682, 683
See application file for complete search history.

(56) References Cited

U.S. PATENT DOCUMENTS

| 6,117,771 A * | 9/2000 | Murphy et al. ............. 438/679 |
| 6,136,699 A * | 10/2000 | Inoue .......................... 438/656 |
| 6,221,764 B1 | 4/2001 | Inoue |
| 6,337,272 B1 | 1/2002 | Hamanaka |
| 6,440,851 B1 * | 8/2002 | Agnello et al. ............. 438/682 |

FOREIGN PATENT DOCUMENTS

| JP | 11-283935 | 10/1999 |
| JP | 2000-243726 | 9/2000 |

OTHER PUBLICATIONS

Chinese Official Action, for Application No. 200310118530.8, dated Apr. 28, 2006.

* cited by examiner

*Primary Examiner*—Mary Wilczewski
*Assistant Examiner*—Toniae M. Thomas
(74) *Attorney, Agent, or Firm*—Antonelli, Terry, Stout and Kraus, LLP.

(57) ABSTRACT

A low resistance Co silicide layer with less leakage current is formed over the surface of the source and drain of a MISFET by optimizing the film forming conditions and annealing conditions upon formation of Co (cobalt) silicide. More specifically, a low resistance source and drain ($n^+$ type semiconductor regions, $p^+$ type semiconductor regions) with less junction leakage current are formed, upon formation of a Co silicide layer by heat treating a Co film deposited over the source and drain ($n^+$ type semiconductor regions, $p^+$ type semiconductor regions) of the MISFET, by depositing the Co film at a temperature as low as 200° C. or less, carrying out heat treatment in three stages to convert the Co silicide layer from a dicobalt silicide ($Co_2Si$) layer to a cobalt monosilicide (CoSi) layer and, then, to a cobalt disilicide ($CoSi_2$) layer, successively.

31 Claims, 13 Drawing Sheets

FABRICATION METHOD OF SEMICONDUCTOR INTEGRATED CIRCUIT DEVICE

BACKGROUND OF THE INVENTION

The present invention relates to a fabrication technique for use in the manufacture of a semiconductor integrated circuit device; and, more particularly, the invention relates to a technique that is effective when applied to a process of forming a Co (cobalt) silicide layer on the surface of the source and drain of a MISFET (Metal Insulator Semiconductor Field Effect Transistor) that is formed in a silicon substrate.

As a silicide process for the purpose of suppressing spikes of Co silicide, there is a known technique of depositing a Co film and a TiN film (oxidation barrier film) on the surface of the source and drain of a silicon substrate, forming a dicobalt silicide ($Co_2Si$) film by application of a first heat treatment at a temperature less than 400° C., removing the TiN film and an unreacted Co film by wet etching, and forming a cobalt disilicide ($CoSi_2$) film by application of a second heat treatment at a temperature ranging from 700 to 900° C. (refer to Japanese Unexamined Patent Publication No. Hei 11(1999)-283935, U.S. Pat. No. 6,221,764, Japanese Unexamined Patent Publication No. 2000-243726 and U.S. Pat. No. 6,337,272).

[Patent Publication 1]

Japanese Unexamined Patent Publication No. Hei 11(1999)-283935

[Patent Publication 2]

U.S. Pat. No. 6,221,764

[Patent Publication 3]

Japanese Unexamined Patent Publication No. 2000-243726

[Patent Publication 4]

U.S. Pat. No. 6,337,272

SUMMARY OF THE INVENTION

The silicide process of forming a Co (cobalt) silicide layer on the surface of semiconductor regions constituting the source and drain of a MISFET, or the surface of a polycrystalline silicon film constituting a gate electrode, is essential for achieving high-speed operation of the MISFET.

It is a common practice to form a Co silicide layer over the surface of the source and drain that have been formed over a silicon substrate by depositing a Co film over the silicon substrate, which has the source and drain formed therein, by sputtering; depositing an oxidation barrier film, such as a TiN (titanium nitride) film, over the Co film for preventing oxidation of the Co film; heat treating the silicon substrate to form a Co silicide layer on the interface between the silicon substrate and the Co film; and, then, removing the oxidation barrier film that is no longer required and an unreacted Co film by wet etching.

Upon formation of the Co silicide layer by the above-described process, it is important to suppress, as much as possible, an increase in the junction leakage current resulting from a deterioration in flatness (a phenomenon known as so-called "spiking") on the interface between the silicon substrate and the Co silicide layer.

It is known that the heat treatment of the Co film that has been deposited over the silicon substrate changes the composition of the Co silicide layer that is formed on the interface therebetween from dicobalt silicide ($Co_2Si$) to cobalt monosilicide (CoSi) and, then, to cobalt disilicide ($CoSi_2$), and the resistance of the cobalt disilicide ($CoSi_2$), which is the final silicide, is the lowest.

As a result of careful investigation of the deposition of a Co film by a sputtering and subsequent heat treatment procedure, the present inventors have obtained the findings as described below.

In the conventional Co silicide process, when a Co film is deposited over a silicon substrate by sputtering, an undesired reaction layer is formed on the interface between the Co film during formation and the silicon substrate owing to an increase in the substrate temperature caused by, for example, the collision energy of cobalt. This reaction layer is apt to have an uneven thickness, because the time spent for the formation of the Co film is short and the temperature in the wafer plane does not increase uniformly. The flatness of the interface between the silicon substrate and the cobalt disilicide layer, which will be formed by the subsequent heat treatment, is deteriorated, reflecting the variations in the thickness of the reaction layer, which shortens the distance between the bottom of the source and drain and the bottom of the Co silicide layer, leading to an increase in the junction leakage current.

In addition, upon conversion of dicobalt silicide ($Co_2Si$) to cobalt monosilicide (CoSi) and, then, to cobalt disilicide ($CoSi_2$) by low temperature heat treatment and high temperature heat treatment of the Co film that is deposited over the silicon substrate, a reaction between the Co and the silicon proceeds rapidly, and high-resistance dicobalt silicide ($Co_2Si$) and cobalt monosilicide (CoSi) layers remain on the interface between the cobalt disilicide ($CoSi_2$) layer, the final product, and the silicon substrate. This increases the parasitic resistance between the source and drain, causing a problem of signal delay.

Therefore, it is an object of the present invention to provide a technique that is capable of forming, over the surface of a source and drain of a MISFET, a low resistance Co silicide layer not causing signal delay and having less leakage current.

The above-described and other objects, and novel features of the present invention will be apparent from the description herein and the accompanying drawings.

Typical aspects, of the invention disclosed in the present application will be outlined briefly.

The method of fabrication of a semiconductor integrated circuit device according to the present invention comprises the steps of:

(a) depositing a cobalt film at a temperature less than 200° C. over the main surface of a silicon wafer in a first sputtering chamber of a sputtering apparatus equipped with a plurality of chambers including at least a sputtering chamber and a heat treatment chamber;

(b) depositing an oxidation barrier film at a temperature of 200° C. or greater, but less than 400° C., over the main surface of the silicon wafer having the cobalt film deposited thereover in a second sputtering chamber of the sputtering apparatus;

(c) heating the silicon wafer having the oxidation barrier film deposited thereover at a temperature of 200° C. or greater, but less than 400° C., in the second sputtering chamber and forming a silicide layer having dicobalt silicide ($Co_2Si$) as a main component on the interface between the silicon wafer and the cobalt film;

(d) after the step (c), heating the silicon wafer at a temperature of 400° C. or greater, but less than 700° C., in the heat treatment chamber of the sputtering apparatus to convert the main component of the silicide layer from dicobalt silicide into cobalt monosilicide (CoSi);

(e) after the step (d), removing the oxidation barrier film and an unreacted portion of the cobalt film from the main surface of the silicon wafer; and (f) after the step (e), heating the silicon wafer at a temperature of 700° C. or greater, but less than 900° C., to convert the main component of the silicide layer from cobalt monosilicide to cobalt disilicide ($CoSi_2$).

Outlines of other examples of the invention included in the present application will be itemized below.

20. A method of fabrication of a semiconductor integrated circuit device, comprises the steps of:

(a) depositing cobalt over semiconductor regions of a silicon base surface region over the main surface of a wafer, which are to be source and drain regions of a MISFET, while maintaining the temperature of the wafer at a first temperature which does not substantially cause a reaction between silicon and cobalt;

(b) after the step (a), subjecting the first main surface of the wafer having cobalt deposited thereover to a first heat treatment at a second temperature that is higher than the first temperature to react silicon in the silicon base surface region and the cobalt thus deposited;

(c) after the step (b), removing an unreacted portion of cobalt thus deposited; and (d) subjecting the first main surface of the wafer from which the unreacted portion of cobalt has been removed to a second heat treatment at a third temperature that in higher than the second temperature to convert a film formed by a reaction between the remaining cobalt and silicon into a film composed mainly of cobalt disilicide.

21. In a method of fabrication of a semiconductor integrated circuit device as described above in 20, the first temperature is less than 200° C.

22. A method of fabrication of a semiconductor integrated circuit device as described above in 21, wherein the first heat treatment step comprises the steps of:

(i) subjecting the first main surface of the wafer having cobalt deposited thereover to pretreatment at a fourth temperature that is higher than the first temperature, but lower than the second temperature, to react silicon in the silicon base surface region with the cobalt thus deposited and convert a portion of the deposited cobalt into a first silicide member composed mainly of dicobalt silicide; and (ii) after the step (i), subjecting the first main surface of the wafer to a first heat treatment at the second temperature to convert the first silicide member into a second silicide member composed mainly of cobalt monosilicide.

23. In a method of fabrication of a semiconductor integrated circuit device as described above in 22, the first temperature is less than 100° C.

24. In a method of fabrication of a semiconductor integrated circuit device as described above in 22, the first temperature is less than 50° C.

25. In a method of fabrication of a semiconductor integrated circuit device as described above in 22, the first temperature is normal temperature.

26. In a method of fabrication of a semiconductor integrated circuit device as described above in 25, the first temperature is less than 35° C.

27. In a method of fabrication of a semiconductor integrated circuit device as described above in 22, cobalt is deposited by sputtering.

28. In a method of fabrication of a semiconductor integrated circuit device as described above in 27, the sputtering is high directional sputtering.

29. In a method of fabrication of a semiconductor integrated circuit device as described above in 28, the high directional sputtering is long throw sputtering.

30. In a method of fabrication of a semiconductor integrated circuit device as described above in 22, the wafer to be treated is not exposed to the outside air during the period from the initiation of the step (i) to the completion of the step (ii).

DETAILED DESCRIPTION OF THE INVENTION

Figure 1:
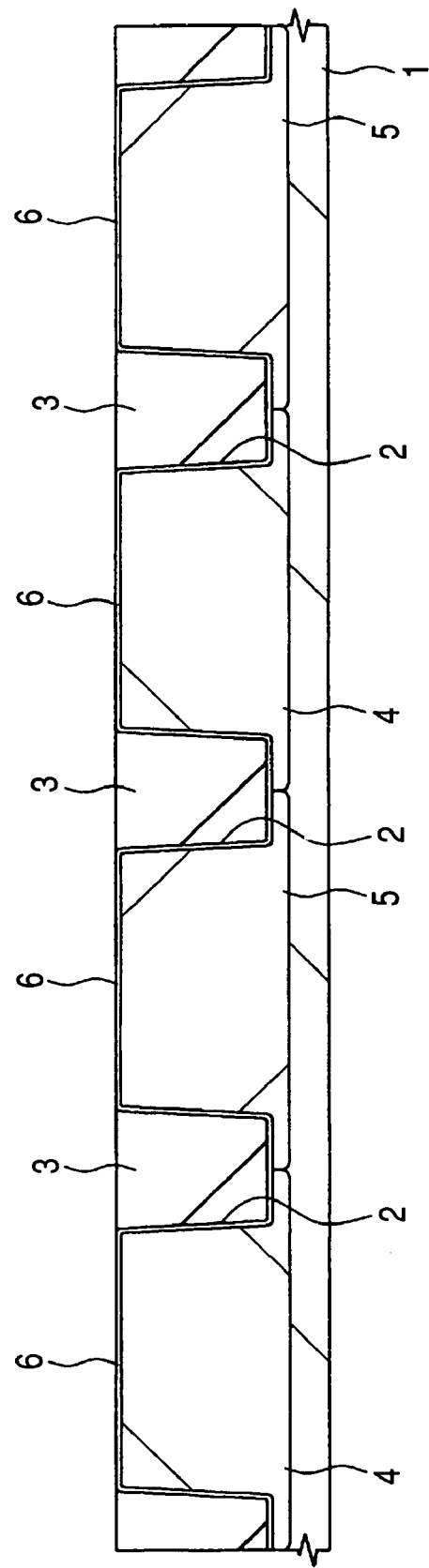
FIG. 1 is a fragmentary cross-sectional view of a semiconductor substrate illustrating a step in the method of fabrication of a semiconductor integrated circuit device according to one embodiment of the present invention.

The embodiments of the present invention will be described specifically based on the accompanying drawings. In all of the drawings, members having a like function will be identified by like reference numerals, and overlapping descriptions thereof will be omitted.

In the description of the embodiments, the subject matter of the invention may be divided in plural sections or in plural embodiments if necessary for convenience's sake. These plural sections or embodiments are not to be considered independent of each other, but have a relation such that one represents a modification example, details or a complementary description of a part or whole of the other one, unless otherwise specifically indicated.

In the described examples, when reference is made to a number of elements (including the number, value, amount and range), the number is not limited to a specific number, but can be greater than or less than the specific number, unless otherwise specifically indicated, or when it is principally apparent that the number is limited to the specific number.

Moreover in the description of the described embodiments, it is needless to say that the constituent elements (including element steps) are not always essential, unless otherwise specifically indicated, or when it is principally apparent that they are essential.

Similarly, in describing the embodiments, when a reference is made to the shape or positional relationship of the constituent elements, that substantially analogous or similar to it is also embraced, unless otherwise specifically indicated, or when it is principally apparent that it is not. This also applies to the above-described value and range.

The term "semiconductor integrated circuit device" as used herein means not only that formed over a single crystal silicon wafer, but also that formed over an SOI substrate, TFT liquid crystals formed on another substrate or the like, unless otherwise specifically indicated that it is not. The term "wafer" means not only a single crystal silicon wafer, but also an SOI substrate or a substantially disk-shaped or rectangular integrated circuit substrate for the formation of TFT liquid crystals, unless otherwise specifically indicated that it is not.

The term "silicon" as used with regard to the surface portion of a silicon substrate or so-called polysilicon electrode embraces a silicon base member having silicon as a main component and having an impurity introduced therein as needed and a silicon base member having improved performance by adding germanium or the like to silicon to form its alloy (the substrate surface region the component of which is converted into SiGe, or the polysilicon electrode the component of which is converted into SiGe), unless otherwise specifically indicated that it is not, or when it is apparent that it is not.

The term "polysilicon" embraces not only typical polycrystalline silicon, but also amorphous silicon and microcrystalline silicon, unless otherwise specifically indicated that it is not, or when it is apparent that it is not. This is because polysilicon, which is sometimes amorphous silicon at the beginning of its formation, usually changes into "polysilicon in the narrow meaning" by the heat treatment conducted later, but it is difficult to specify the time when this change into "polysilicon in the narrow meaning" occurs.

When reference is made to components of a member (for example, member X composed of A), the other components are not excluded, unless otherwise specifically indicated that they are not, or when it is apparent that they are not. This will equally apply to an atmospheric gas.

It is needless to say that a gate insulating film for a CMOS integrated circuit is not limited to an oxide film. It also embraces, for example, a silicon nitride film, which is a non-oxide-film type inorganic insulating film, as the gate insulating film. This will equally apply to the terms "metal" and "semiconductor".

In this Embodiment, the method is applied to the fabrication of a CMOS-LSI. The method of fabrication will be described next in the order of the steps thereof, based on FIGS. 1 to 11.

As illustrated in FIG. 1, an isolation groove 2 is formed in a semiconductor substrate (which will hereinafter be called a "substrate" or "wafer") 1 having a specific resistance of from 1 to 10 Ωcm and which is made of p type single crystal silicon. This isolation groove 2 is formed by etching the substrate 1 in an element isolation region to form a groove, depositing a silicon oxide film 3 over the substrate 1, including the inside of the groove, by CVD and removing an unnecessary portion of the silicon oxide film 3 outside the groove by chemical mechanical polishing.

A p type well 4 and an n type well 5 are formed by ion implantation of boron in one portion of the substrate 1 and phosphorus in the other portion, respectively, followed by steam oxidation of the substrate 1, whereby a gate oxide film 6 is formed over the surface of each of the p type well 4 and n type well 5.

Figure 2:
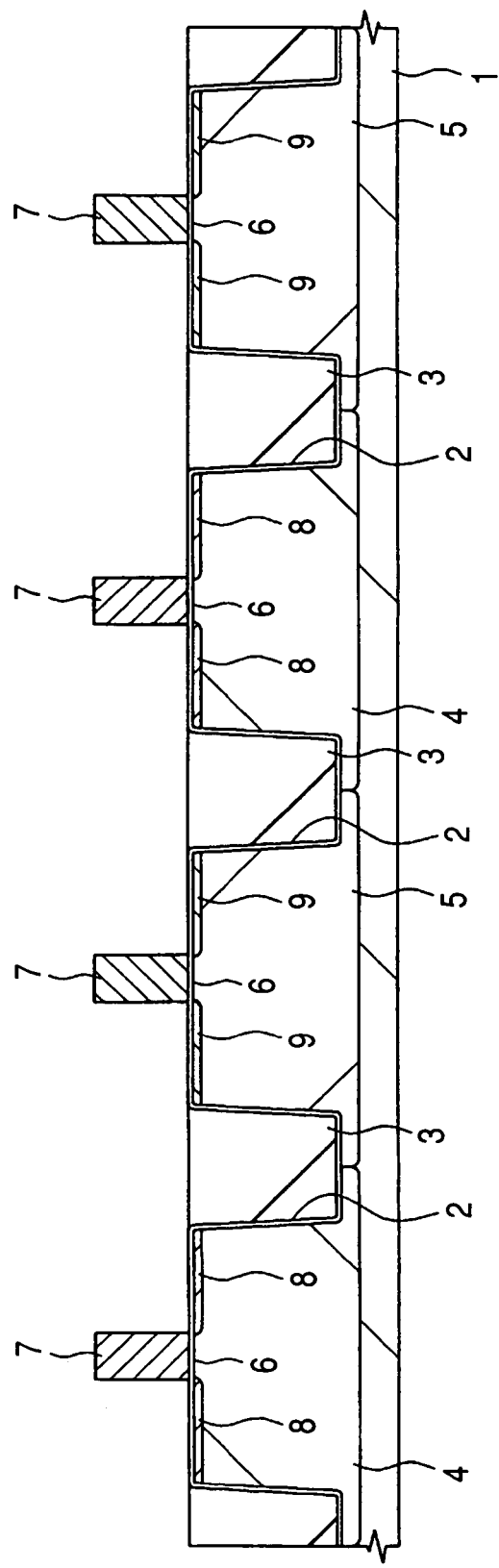
FIG. 2 is a fragmentary cross-sectional view of a semiconductor substrate illustrating a subsequent step in the method of fabrication of a semiconductor integrated circuit device according to the one embodiment of the present invention.

As illustrated in FIG. 2, a gate electrode 7 is formed over each of the p type well 4 and n type well 5 (a CMOS or CMIS integrated circuit having a so-called dual gate structure). This gate electrode 7 is formed, for example, by depositing a polycrystalline silicon film (in practice, the polycrystalline silicon film tends to be in the amorphous condition upon deposition, but it becomes polycrystalline in response to any one of the heat treatments conducted later, so that unless otherwise specifically indicated, silicon in the amorphous condition is included the in "polycrystalline silicon") over the gate oxide film 6 by CVD, implanting phosphorus ions in the polycrystalline silicon film over the p type well 4, implanting boron ions in the polycrystalline silicon film over the n type well 5, and then patterning the polycrystalline silicon film by dry etching using a photoresist film as a mask.

Phosphorus or arsenic ions are then implanted in the p type well 4 to form $n^-$ type semiconductor regions 8 having a low impurity concentration, while boron ions are implanted in the n type well 5 to form $p^-$ type semiconductor regions 9 having a low impurity concentration.

Figure 3:
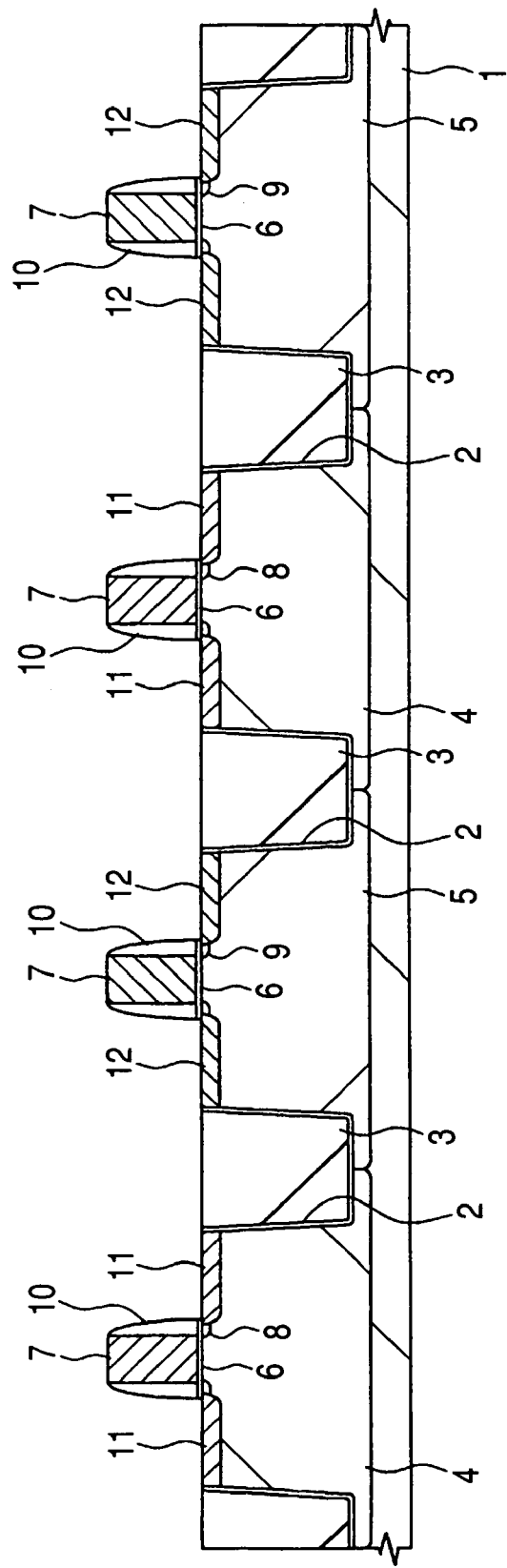
FIG. 3 is a fragmentary cross-sectional view of a semiconductor substrate illustrating a subsequent step in the method of fabrication of a semiconductor integrated circuit device according to the one embodiment of the present invention.

As illustrated in FIG. 3, a silicon nitride film that has been deposited over the substrate 1 by CVD is anisotropically etched to form a sidewall spacer 10 over each of the sidewalls of the gate electrode 7 and, at the same time, to expose the surface of the substrate 1 ($n^-$ type semiconductor region 8, $p^-$ type semiconductor region 9). The p type well 4 is then implanted with phosphorus or arsenic ions to form $n^+$ type semiconductor regions 11 (source, drain) having a high impurity concentration, while the n type well 5 is implanted with boron ions to form p⁺ type semiconductor regions 12 (source, drain) having a high impurity concentration.

After the surface of the substrate 1 is batch-washed with buffered hydrofluoric acid (washing for the purpose of removing a natural oxide film from the silicon surface, or for removing a CVD oxide film when the ion implantation is conducted via the oxide film), a Co (cobalt) silicide layer is formed, in the below-described manner, over the surface of each of the gate electrode 7, n⁺ type semiconductor regions 11 (source, drain) and p⁺ type semiconductor regions 12 (source, drain). This silicide layer forming process is a so-called "silicide process" in which silicide formation over the gate and source/drain is conducted in self alignment by making use of the separation action of the sidewall. This system has the advantage of forming silicide even over the gate and lowering the resistance thereof. In the case of a polymetal gate electrode (or metal electrode), on the other hand, the resistance is reduced more by the metal, and there is no need for silicide formation, so that prior to the deposition of cobalt, an insulating film must be laid over the gate electrode to cover it.

Figure 4:
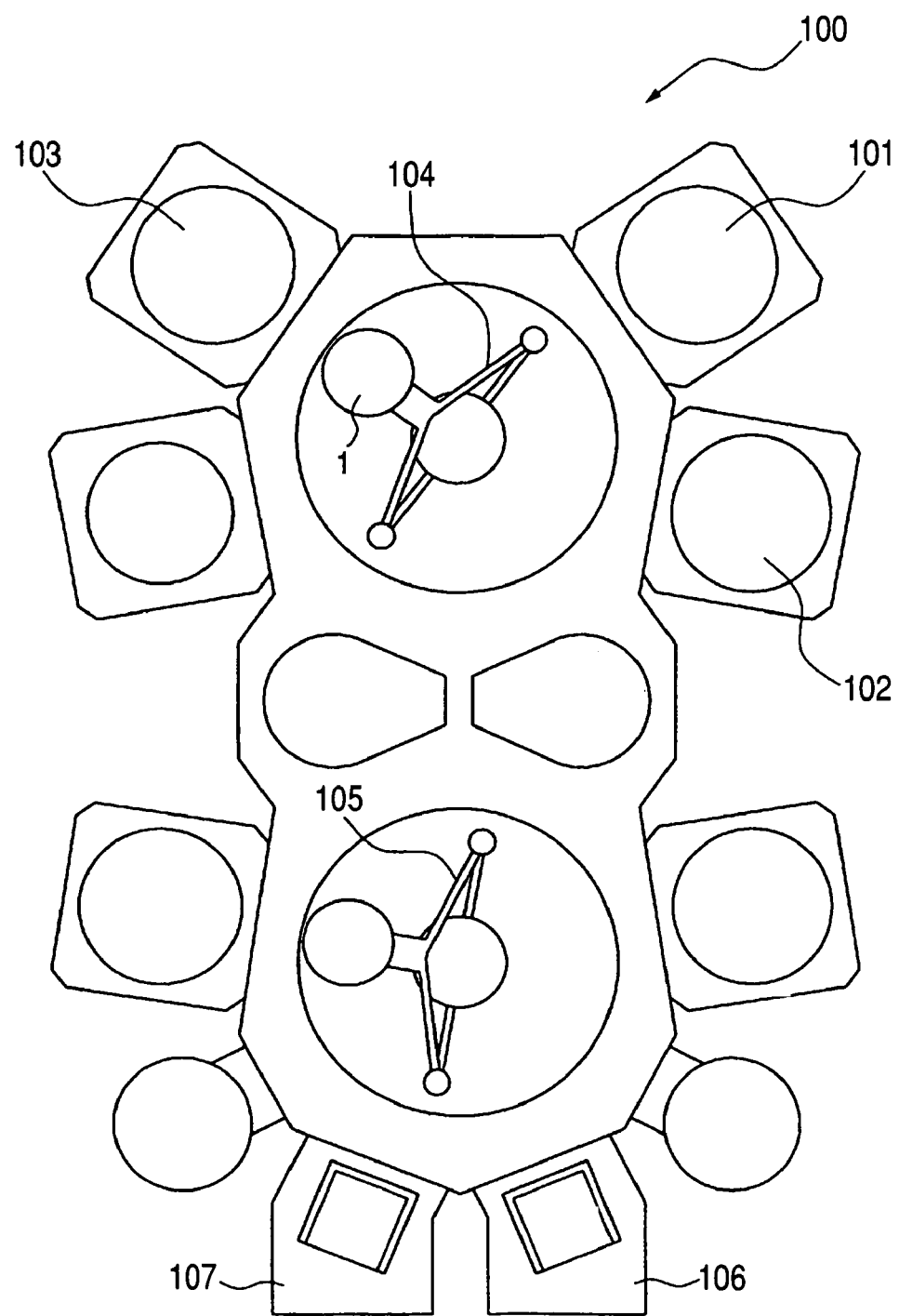
FIG. 4 is a schematic plan view of a single-wafer-processing multi-chamber sputtering apparatus of the type used for the formation of a Co silicide layer.

FIG. 4 is a schematic plan view of a single-wafer-processing multi-chamber sputtering apparatus of the type to be used for the formation of a Co silicide layer. Similar to many multi-chamber system apparatuses, this apparatus permits the transfer of a wafer without bringing it in contact with the outside air between chambers. When steps from deposition (sputtering) of cobalt to second annealing are conducted without contact with the outside air in such an apparatus, an oxidation barrier film, which will be described below, is not inevitable. When in this process, successive treatments are not conducted in one integrated multi-chamber apparatus and a wafer before the treatment is brought into contact with the outside air (for example, the wafer is released into the air after cobalt deposition and the oxidation barrier film, such as TiN, is sputtered in another apparatus), use of an oxidation barrier film, such as TiN, which will be described below, is advantageous. On the contrary, when the wafer is treated, during the above-described steps, without contact with the outside air by using an integrated multi-chamber apparatus, it is advantageous not to use an oxidation barrier film, such as TiN, because damage caused by wet etching upon removal of the barrier film can be avoided.

This sputtering apparatus 100 is equipped with a plurality of chambers, such as a first sputtering chamber 101, a second sputtering chamber 102, and a heat treatment chamber 103, robot hands 104, 105 for carrying the substrate (wafer) 1 to the plurality of chambers, a loader 106 and an unloader 107. The apparatus has a structure permitting film formation and heat treatment continuously inside the apparatus.

Figure 5:
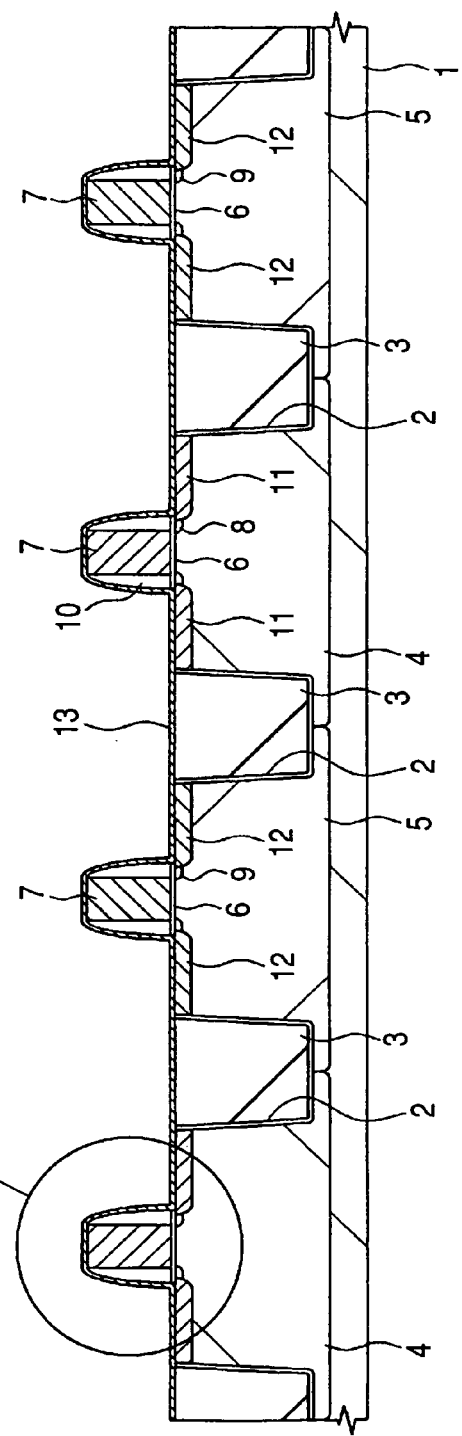
FIG. 5 is a fragmentary cross-sectional view of a semiconductor substrate illustrating a subsequent step in the method of fabrication of a semiconductor integrated circuit device according to the one embodiment of the present invention.

The formation of a Co silicide layer using the sputtering apparatus 100 is conducted by carrying the wafer 1 inside the first sputtering chamber 101 and then depositing a Co film 13 over the main surface of the substrate (wafer 1), as illustrated in FIG. 5.

The Co film 13 is deposited at a temperature that is low enough not to form a reaction layer between Si and Co on the interface between the source/drain (n⁺ type semiconductor regions 11, p⁺ type semiconductor regions 12) formed in the substrate (wafer) 1 and the Co film 13, more specifically, at a temperature less than 200° C., preferably less than 100° C., still more preferably less than 50° C. The "temperature" referred to here means the surface temperature (main surface on the integrated circuit formation side) of the wafer 1 in the first sputtering chamber 101.

In this Embodiment, the Co film 13 is deposited to a thickness of about 10 nm, while maintaining the surface temperature of the wafer 1 at room temperature (25° C.) (the term "room temperature" means a temperature of 15° C. or greater, but less than 35° C., with 25° C. as a center, but a temperature outside the above-described range is not excluded). In order to maintain the surface temperature of the wafer 1 at room temperature (25° C.), it is recommended to adopt heat exchange countermeasures, for example, by constituting an electrostatic chuck from a material exhibiting good heat dissipation or by circulating a coolant in the electrostatic chuck. Not only the electrostatic chuck, but also a chuck of another type may be used. When an electrostatic chuck is used, the temperature control and temperature distribution characteristics are superior because of good adhesion with a wafer. Even after such countermeasures are taken, extension of the formation time of the Co film 13 causes a gradual increase of the temperature of the wafer 1 owing to heat (sometimes causes uneven temperature distribution) generated by the collision of cobalt molecules, so that, in this Embodiment, the deposition is completed within a short time (for example 10 seconds) less than 15 seconds, desirably not greater than 10 seconds. Upon deposition, the purity of the target cobalt, excluding nonmetal impurities, is preferably 99.99 wt. % or greater, more preferably 99.999 wt. % or greater. The argon atmospheric pressure ranges from, for example, 0.4 to 1 Pa (not limited to this range), and a target distance (the shortest distance between the target and the wafer upon operation) is for example 50 mm (ordinarily employed sputtering apparatus). A highly directional sputtering apparatus (long throw sputtering apparatus or ionizing sputtering apparatus having a target distance of about 190 mm) is desired for attaining good coverage characteristics.

By forming the Co film 13 at a low temperature and preventing generation of a reaction layer between Si and Co on the interface between the substrate (wafer) 1 and the Co film 13 during film formation, the subsequent silicide reaction can be allowed to proceed smoothly.

Figure 6:
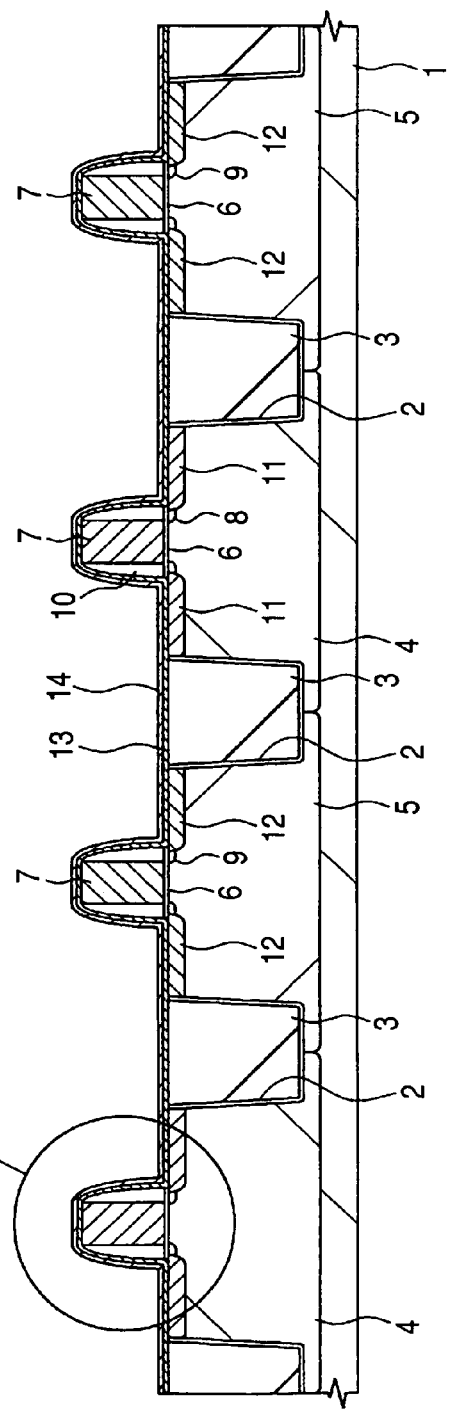
FIG. 6 is a fragmentary cross-sectional view of a semiconductor substrate illustrating a subsequent step in the method of fabrication of a semiconductor integrated circuit device according to the one embodiment of the present invention.
Figure 6:
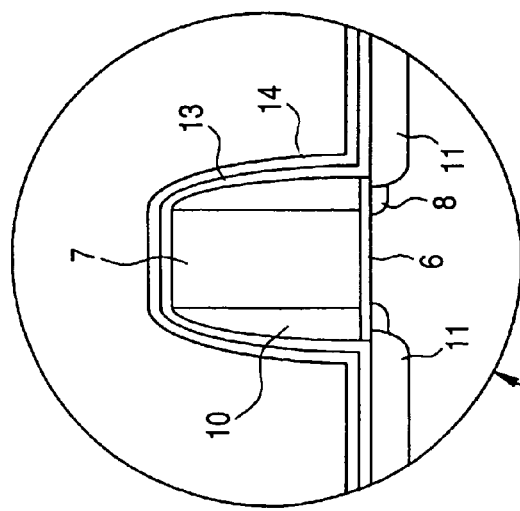
Figure 7:
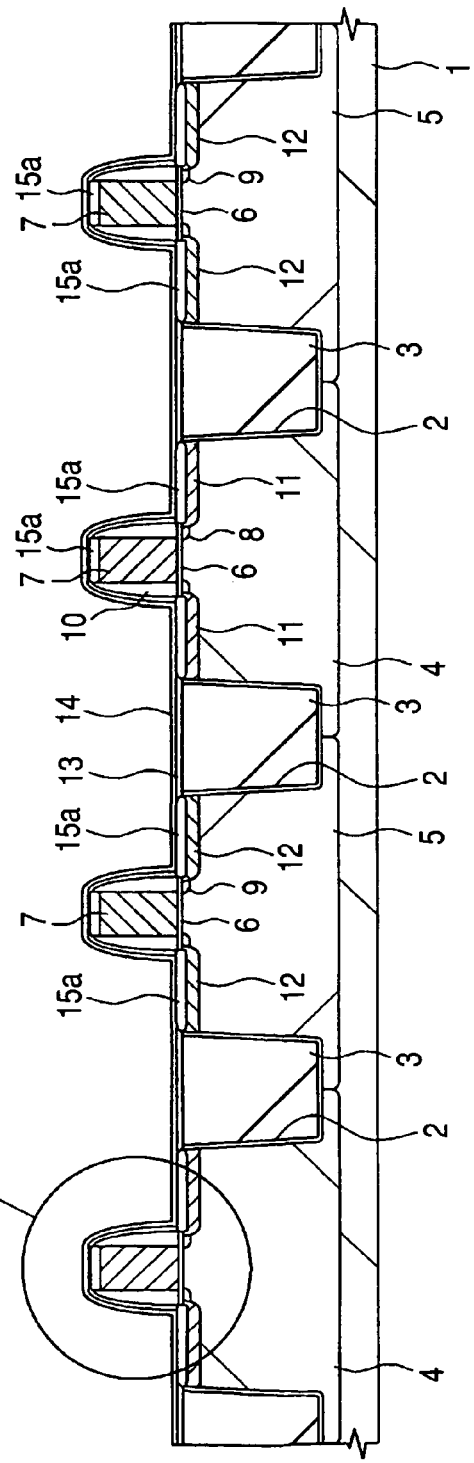
FIG. 7 is a fragmentary cross-sectional view of a semiconductor substrate illustrating a subsequent step in the method of fabrication of a semiconductor integrated circuit device according to the one embodiment of the present invention.
Figure 8:
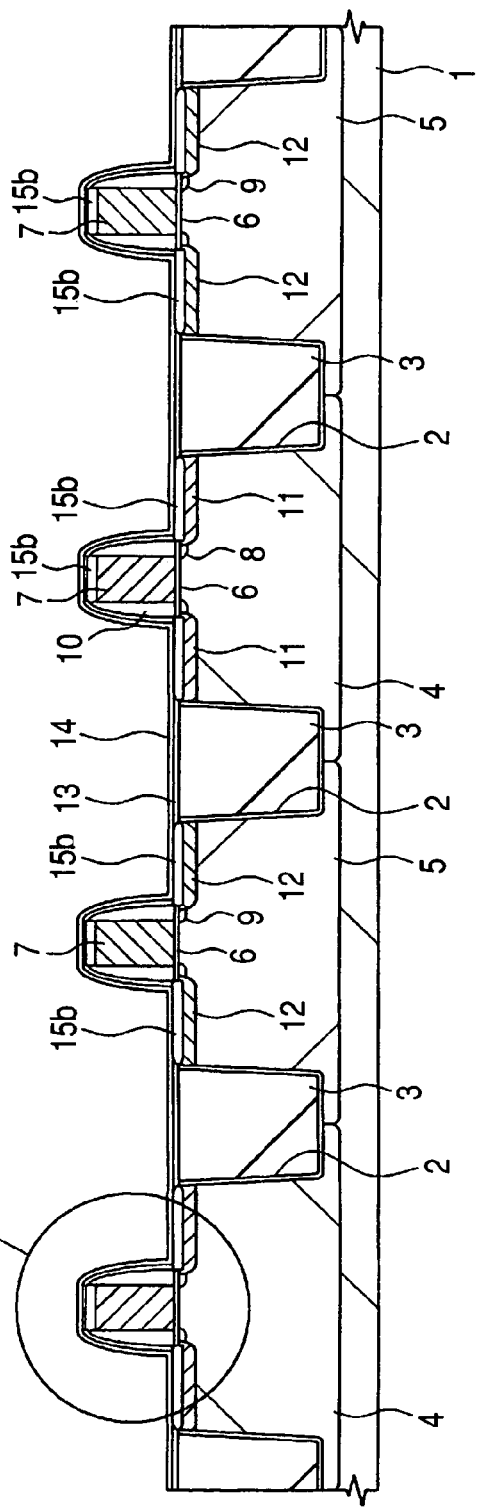
FIG. 8 is a fragmentary cross-sectional view of a semiconductor substrate illustrating a subsequent step in the method of fabrication of a semiconductor integrated circuit device according to the one embodiment of the present invention.
Figure 8:
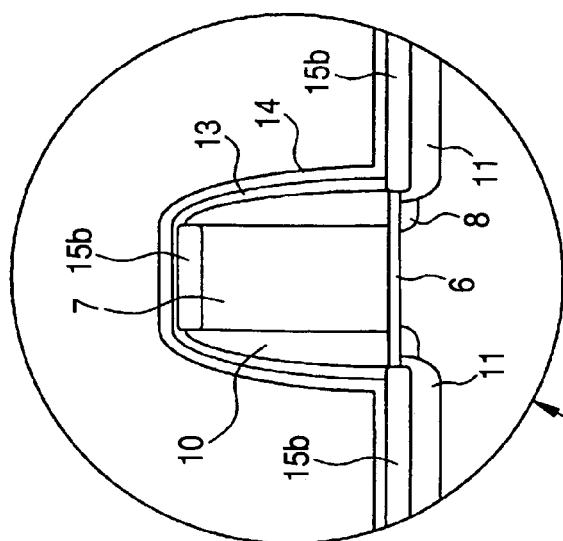

The wafer 1 is then transferred from the first sputtering chamber 101 to the second sputtering chamber 102. As illustrated in FIG. 6, a TiN (titanium nitride) film 14 of about 10 nm in thickness is deposited over the Co film 13. The TiN film 14 serves as an oxidation barrier film for preventing the surface of the Co film 13 from being oxidized during the procedure of forming a Co silicide layer. As the oxidation barrier film, not only the TiN film 14, but also a nitrided metal compound film, such as a WN (tungsten nitride) film or TaN (tantalum nitride) film, can be used.

The sputtering for the deposition of the TiN film is performed by so-called reactive sputtering. More specifically, the sputtering for the formation of an oxidation barrier film is conducted using a titanium target (in the case of a TiN film) in a mixed gas atmosphere of argon and nitrogen (for example, at an atmospheric pressur of from 0.4 to 1 Pa, but not limited thereto). Upon sputtering, the purity of the target titanium, excluding non-metal impurities, is preferably 99.99 wt. % or greater, more preferably 99.999 wt % or greater. The target distance (the shortest distance between the target and the wafer upon operation) is, for example, 50 mm (ordinarily employed sputtering apparatus). When better coverage characteristics are desired, however, use of a high directional sputtering apparatus (such as long throw sputtering apparatus having a target distance of about 190 mm) is preferred. It has been proved that the use of the TiN film as an oxidation barrier film for aluminum interconnects or damascene interconnects contributes to the stabilization of the process.

The TiN film 14 is deposited at a temperature that is low enough not to cause rapid progress of a silicide reaction between the substrate (wafer) 1 and the Co film 13 formed over the surface thereof, more specifically, at a temperature range (surface temperature of the wafer) of 200° C. or greater, but less than 400° C. Since with an increase in the formation time of the TiN film 14, the temperature of the wafer 1 exhibits an excessive rise owing to radiant heat, the deposition is completed in a short time, such as less than 15 seconds, desirably 10 seconds or less (for example, 8 seconds) in this embodiment.

Figure 12:
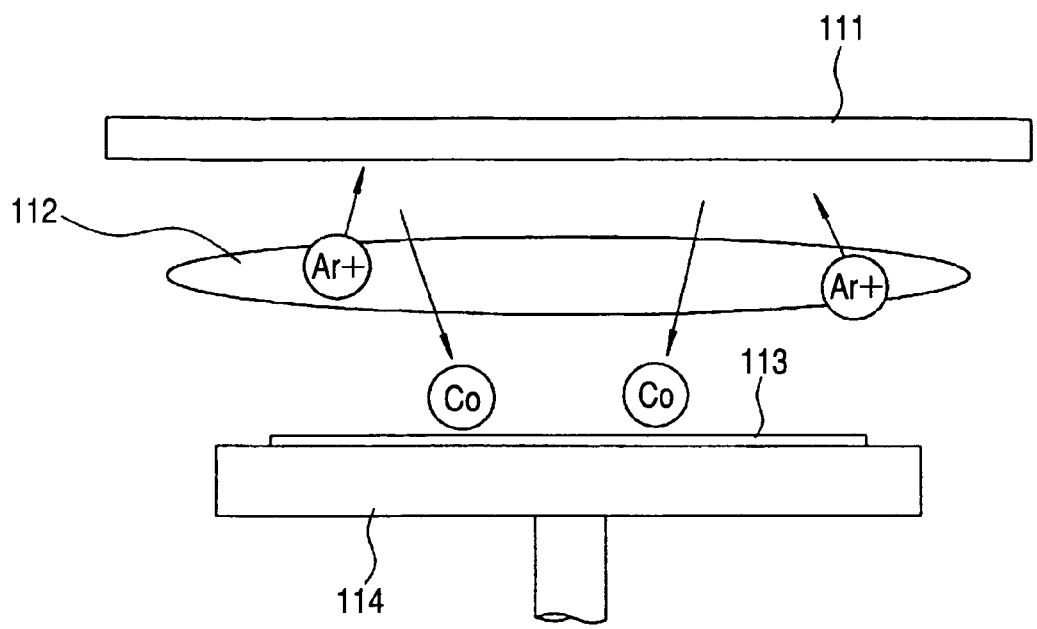
FIG. 12 is a schematic cross-sectional view of a cobalt sputtering apparatus to be used in the one embodiment of the present invention.

Sputtering apparatuses to be used for the above-described Co sputtering and sputtering of an oxidation barrier (refractory metal nitride) film, such as TiN, will be described next in detail. FIG. 12 shows a Co sputtering apparatus, including a high purity cobalt target 111, an Ar (argon) plasma 112, an integrated circuit wafer 113 to be sputtered and a wafer support 114.

Figure 13:
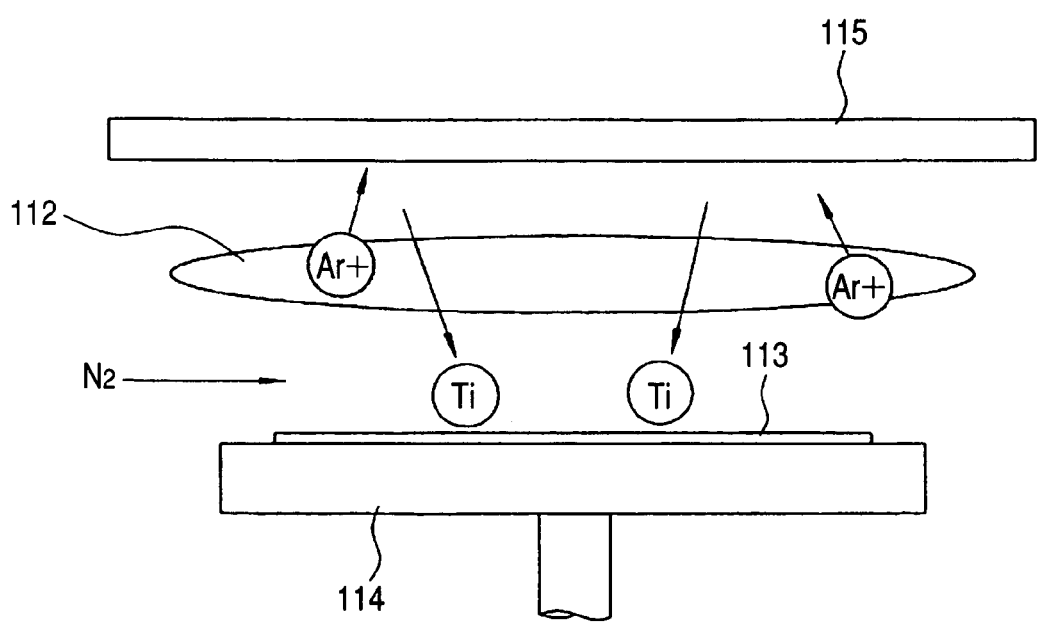
FIG. 13 is a schematic cross-sectional view of a TiN sputtering apparatus to be used in the one embodiment of the present invention.

FIG. 13 illustrates a sputtering apparatus for deposition of TiN, including a high-purity Ti target 115, an Ar plasma 112, an integrated circuit wafer 113 to be sputtered and a wafer support 114. Reactive sputtering is employed in this case, so that sputtering is conducted in the flow of a nitrogen gas.

Figure 14:
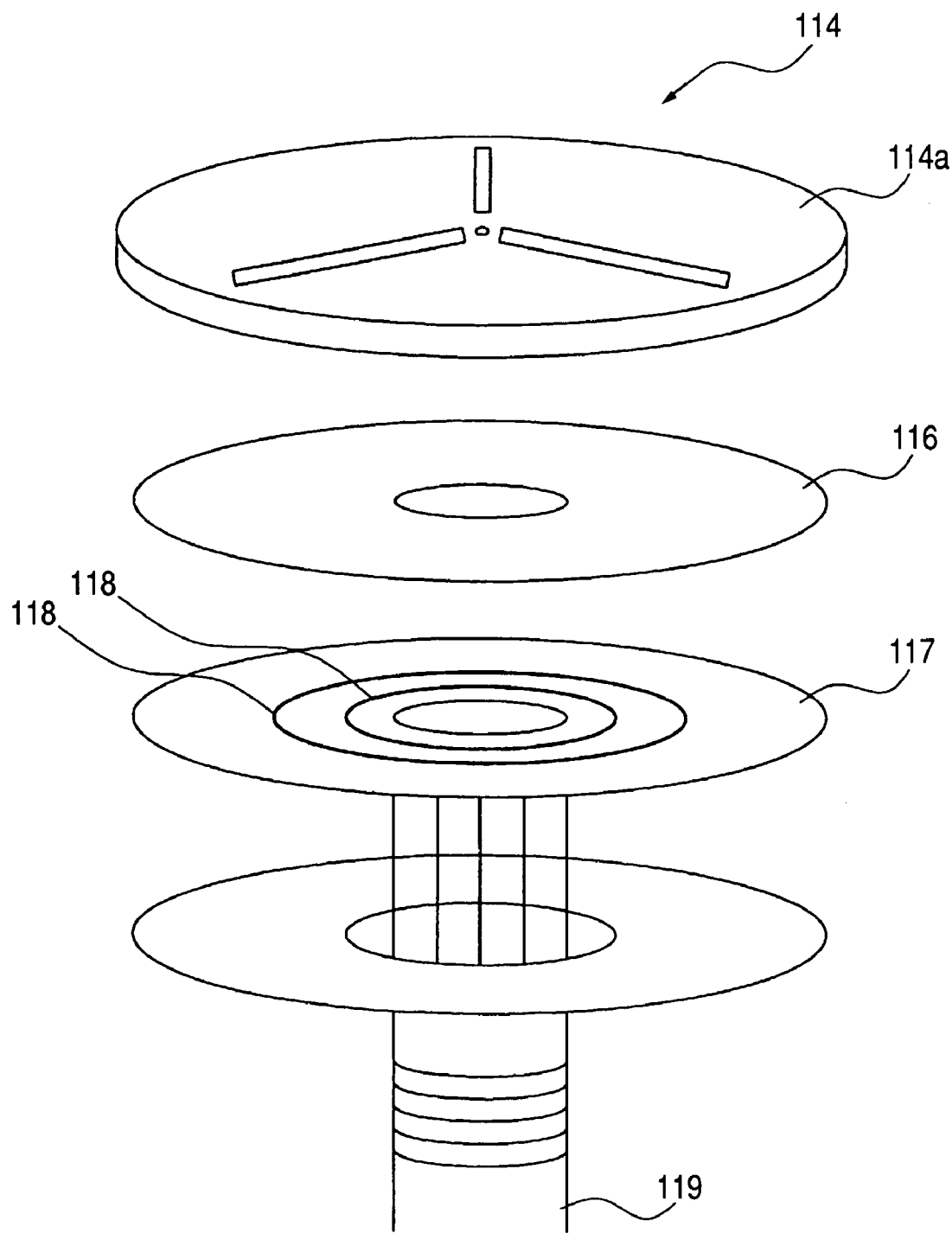
FIG. 14 is a schematic exploded perspective view of the wafer support of the cobalt sputtering apparatus of FIG. 12 and the TiN sputtering apparatus of FIG. 13.

FIG. 14 is an exploded view diagrammatically illustrating the details of the wafer support 114, which includes a main body portion 114a of the wafer support 114, a heater plate (resistance heating type) 116 disposed therebelow for heating, a cooling plate 117 for cooling the wafer, a cooling water line 118 for this cooling, and a flange and bellows 119 to enclose them therein.

By heat treating (first annealing) the wafer 1 in the second sputtering chamber 102, a dicobalt silicide ($Co_2Si$) layer 15 is formed on each of the interface between the source/drain ($n^+$ semiconductor regions 11, $p^+$ type semiconductor regions 12) formed in the substrate (wafer) 1 and the Co film 13 and the interface between the gate electrode 7 made of a polycrystalline silicon film and the Co film 13.

This heat treatment is conducted at a temperature that is low enough not to cause conversion of the main component of the silicide layer 15a from dicobalt silicide ($Co_2Si$) into cobalt monosilicide (CoSi) or cobalt disilicide ($CoSi_2$), which will otherwise occur owing to rapid progress of the silicide reaction on the interface between the source/drain ($n^+$ semiconductor regions 11, $p^+$ type semiconductor regions 12) and the Co film 13, more specifically, within a temperature range (surface temperature of the wafer) of 200° C. or greater, but less than 400° C., which is similar to that of the above-described deposition temperature of the TiN film 14. In this Embodiment, after the TiN film 14 is deposited at a wafer surface temperature set at 300° C. by temperature control or heating via a wafer supporting means (for example, an electrostatic chuck), heat treatment (first annealing) is conducted for about 4 minutes while maintaining the surface temperature of the wafer at 300° C. by further effecting the temperature control or heating via the wafer supporting means.

The wafer 1 is then transferred from the second sputtering chamber 102 to the heat treatment chamber 103 and subjected to a second heat treatment (second annealing) in a non-oxidizing gas atmosphere, whereby the silicide layer 15a, having as a main component dicobalt silicide ($Co_2Si$), is converted into a cobalt monosilicide (Cosi) layer 15b. This heat treatment is conducted at a temperature not permitting conversion of the main component of the silicide layer 15b from cobalt monosilicide (CoSi) into cobalt disilicide ($CoSi_2$) which will otherwise occur owing to rapid progress of the silicide reaction on the interface between the source/drain ($n^+$ semiconductor regions 11, $p^+$ type semiconductor regions 12) and the Co film 13, more specifically, at a temperature range (surface temperature of the wafer) of 400° C. or greater, but less than 700° C. In this Embodiment, RTA (Rapid Thermal Anneal) system heat treatment is conducted in the heat treatment chamber 103 with a nitrogen gas atmosphere at the wafer surface temperature set at 500° C.

Figure 9:
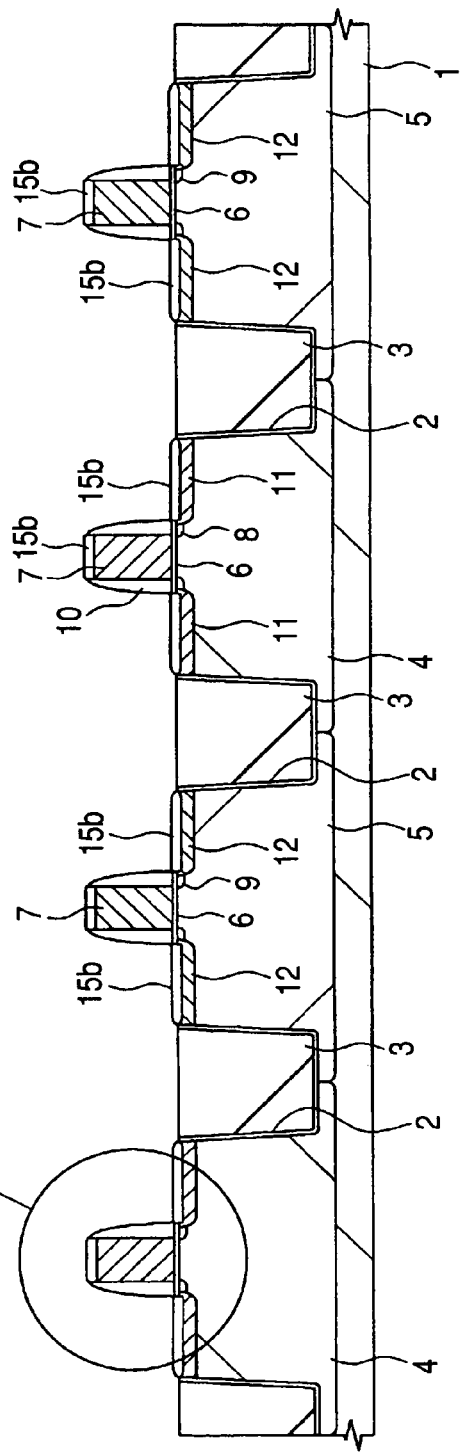
FIG. 9 is a fragmentary cross-sectional view of a semiconductor substrate illustrating a subsequent step in the method of fabrication of a semiconductor integrated circuit device according to the one embodiment of the present invention.
Figure 9:
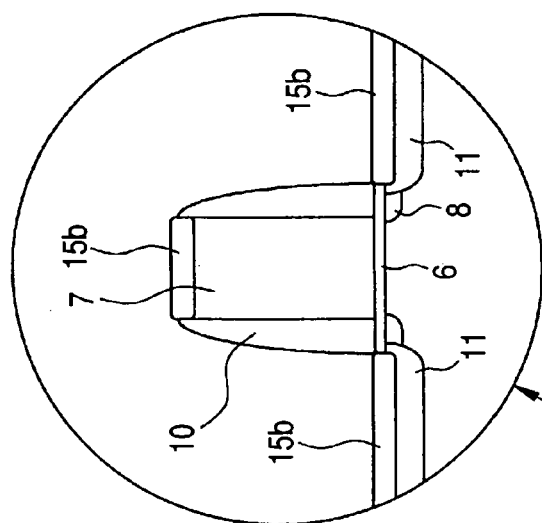

After the wafer 1 is taken out from the sputtering apparatus 100, the TiN film 14 is removed by wet etching with a mixture of ammonia and hydrogen peroxide, followed by removal of an unreacted portion of the Co film 13 by wet etching with a mixture of hydrochloric acid and hydrogen peroxide, as illustrated in FIG. 9.

Figure 10:
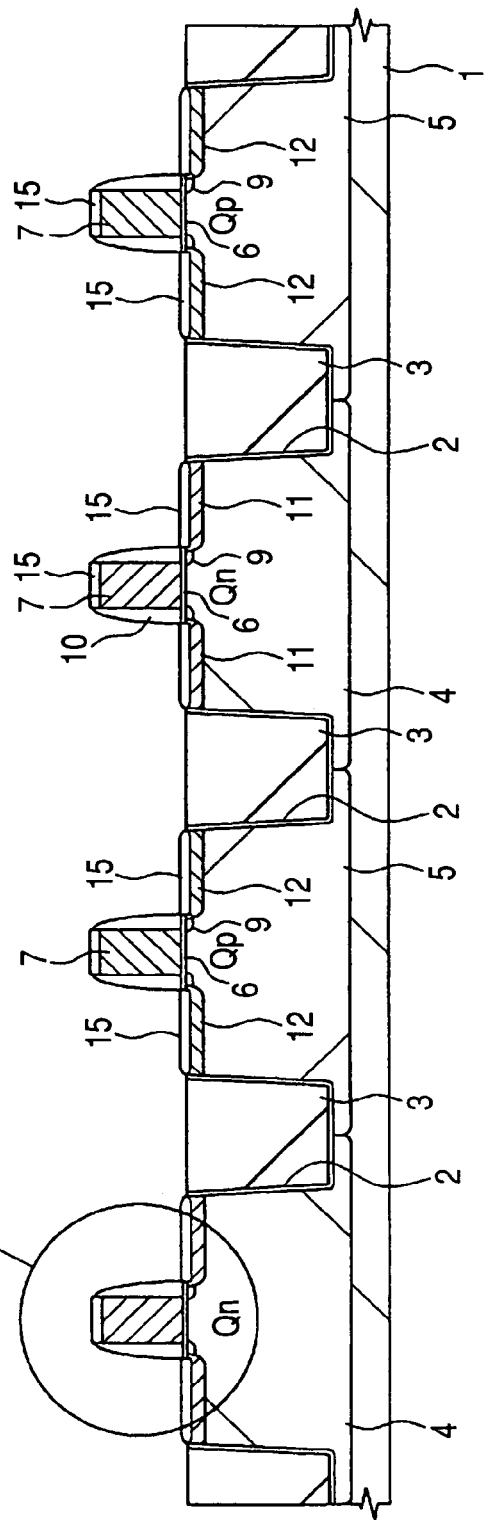
FIG. 10 is a fragmentary cross-sectional view of a semiconductor substrate illustrating a subsequent step in the method of fabrication of a semiconductor integrated circuit device according to the one embodiment of the present invention.

The wafer 1 is then transferred to the heat treatment chamber 103 of the sputtering apparatus 100 or another chamber of a similar multi-chamber type apparatus, or a treatment chamber of another heat treatment apparatus and is subjected to a third heat treatment (third annealing) in a non-oxidizing gas atmosphere, whereby the silicide layer 15b composed mainly of cobalt monosilicide (CoSi) is converted into a cobalt disilicide ($CoSi_2$) layer 15, as illustrated in FIG. 10. This heat treatment is conducted at a temperature higher than that of the second heat treatment, more specifically, within a temperature range of 700° C. or greater, but less than 900° C.

In this Embodiment, the RTA system heat treatment is adopted, while using nitrogen as the atmospheric gas of the heat treatment chamber 103 and setting the wafer surface temperature at 740° C. An RTA apparatus other than the sputtering apparatus 100 can be used for the heat treatment for conversion of the cobalt monosilicide (CoSi) layer 15b into the cobalt disilicide ($CoSi_2$) layer 15. It is generally considered that the use of different apparatuses or different chambers in the same apparatus heightens the throughput when treatment temperatures are different. On the contrary, when the treatments are conducted in the same chamber of one apparatus, many wafers can be treated without using many apparatuses.

By the steps so far mentioned, a silicide layer 15 composed mainly of cobalt disilicide ($CoSi_2$) is formed over the interface between the source/drain ($n^+$ semiconductor regions 11, $p^+$ type semiconductor regions 12) formed in the substrate (wafer) 1 and the Co film 13 and the interface between the gate electrode 7 made of a polycrystalline silicon film and the Co film 13, whereby an n channel type MISFET (Qn) and a p channel type MISFET (Qp) are completed.

Figure 11:
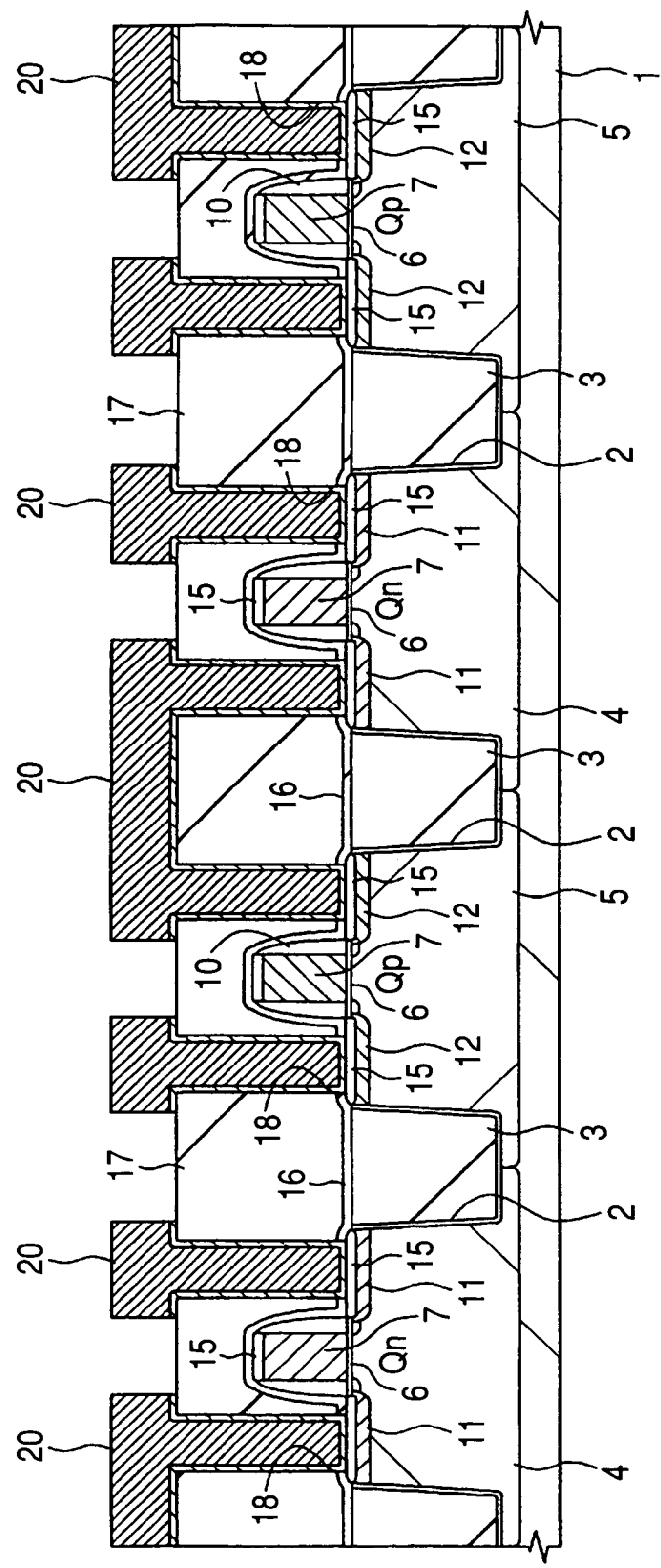
FIG. 11 is a fragmentary cross-sectional view of a semiconductor substrate illustrating a subsequent step in the method of fabrication of a semiconductor integrated circuit device according to the one embodiment of the present invention.

As illustrated in FIG. 11, a silicon nitride film 16 and a silicon oxide film 17 are then deposited over the substrate 1 by CVD. The silicon oxide film 17 and silicon nitride film 16 over the source/drain ($n^+$ semiconductor regions 11, $p^+$ type semiconductor regions 12) are dry etched to form contact holes 18. Over the silicon oxide film 17 including the inside of the contact holes 18, a W interconnect 20 is formed.

By dry etching or CMP, an interconnect plug is formed to fill the contact hole. A titanium film and a titanium nitride film are then formed by sputtering. Also, by sputtering, aluminum and copper are formed into a film in an inert atmosphere of nitrogen or the like at a temperature of about 300° C. Then, an aluminum alloy film is formed as an interconnect metal film between semiconductor elements, whereby a stacked interconnect layer is obtained.

As described above, in the method of formation of a CO silicide layer according to this Embodiment, no undesired reaction layer is formed on the interface between the Co film 13 during formation and the substrate 1 because the Co film 13 is formed at a low temperature. It is therefore possible to planarize the interface between the substrate 1 and the finally-formed silicide layer 15 composed mainly of cobalt disilicide ($CoSi_2$) and, thereby, to prevent an increase in the junction leakage current.

In addition, heat treatment after the deposition of the Co film 13 is divided into three stages so as to gradually carry out conversion from the dicobalt silicide ($Co_2Si$) layer 15a to the cobalt monosilicide (CoSi) layer 15b, and, then, to the cobalt disilicide ($CoSi_2$) layer 15, so that the cobalt monosilicide (CoSi) layer 15b or dicobalt silicide ($Co_2Si$) layer 15a having a high resistance does not remain on the interface between the substrate 1 and the finally-formed cobalt disilicide ($CoSi_2$) layer 15.

This makes it possible to maintain a fixed distance between the bottom of the source/drain ($n^+$ type semiconductor regions 11, $p^+$ type semiconductor regions 12) and the bottom of the cobalt disilicide ($CoSi_2$) layer 15 and, thereby, prevent an increase in the junction leakage current. Moreover, the parasitic resistance decreases and no signal delay occurs, because no high resistance layer is formed on the interface between the cobalt disilicide ($CoSi_2$) layer 15 and the substrate 1.

The present invention by the present inventors has been described specifically based on various embodiments thereof. It should be borne in mind, however, that the present invention is not limited to or by the foregoing embodiments, but can be modified to an extent not departing from the gist of the invention. For example, the deposition of the TiN film and the first heat treatment were carried out in the same sputtering chamber in the above-described Embodiment, but they may be conducted in separate chambers.

When the MISFET of the present invention is applied to an SRAM (Static Random Access Memory) having a full CMOS type memory cell formed of six transistors, the source and drain of the MISFET constituting the flip flop of the memory cell is formed just below the surface of the silicon substrate which has been converted into cobalt silicide, so that the junction leakage current under the standby state can be reduced.

Advantages available from the typical aspects of the invention, and features of the invention disclosed by the present application, will next be described briefly.

Upon formation of a Co silicide layer by the heat treatment of a Co film deposited over the source and drain of a MISFET, the source and drain can be formed to have less junction leakage current and low resistance by carrying out the heat treatment in three stages, so as to convert the main component of the Co silicide layer from a dicobalt silicide ($Co_2Si$) to cobalt monosilicide (CoSi) and, then, to cobalt disilicide ($CoSi_2$), successively.

What is claimed is:

1. A fabrication method of a semiconductor integrated circuit device, comprising:
   a first step of depositing a cobalt film over the main surface of a silicon substrate, the cobalt film being deposited on a bare silicon surface of the main surface of the silicon substrate; and
   a second step of heat treating the silicon substrate to form a silicide layer on the interface between the silicon substrate and the cobalt film,
   wherein in the first step, the cobalt film is deposited at a temperature lower than a temperature at which a reaction layer of silicon and cobalt is formed on the interface between the bare silicon substrate surface and the cobalt film, said temperature, lower than the temperature at which said reaction layer is formed, being maintained until the end of depositing the cobalt film, and
   wherein the heat treatment of the silicon substrate in the second step comprises the steps of:
   (a) a first-stage heat treatment for forming a disilicide layer having, as a main component, dicobalt silicide ($Co_2Si$) on the interface between the silicon substrate and the cobalt film;
   (b) a second-stage heat treatment for forming the main component of the monosilicide layer from dicobalt silicide into cobalt monosilicide (CoSi); and
   (c) removing an unreacted portion of the cobalt film from the main surface of the silicon substrate after the second-stage heat treatment, and a third-stage heat treatment for forming a main component of a cobalt disilicide layer by converting from cobalt monosilicide to cobalt disilicide ($CoSi_2$).

2. A fabrication method of a semiconductor integrated circuit device according to claim 1,
   wherein the cobalt film is deposited at a temperature less than 200° C.

3. A fabrication method of a semiconductor integrated circuit device according to claim 2,
   wherein the cobalt film is deposited at a temperature less than 100° C.

4. A fabrication method of a semiconductor integrated circuit device according to claim 3,
   wherein the cobalt film is deposited at a temperature less than 50° C.

5. A fabrication method of a semiconductor integrated circuit device according to claim 1,
   wherein the temperature of the first-stage heat treatment falls within a range of 200° C. or greater but less than 400° C., the temperature of the second-stage heat treatment falls within a range of 400° C. or greater but less than 700° C., and the temperature of the third-stage heat treatment falls within a range of 700° C. or greater but less than 900° C.

6. A fabrication method of a semiconductor integrated circuit device according to claim 1, further comprising, between the first and second steps, a step of depositing an oxidation barrier film over the cobalt film.

7. A fabrication method of a semiconductor integrated circuit device, comprising the steps of:
   (a) depositing a cobalt film over the main surface of a silicon wafer in a first sputtering chamber of a sputtering apparatus equipped with a plurality of chambers including at least a sputtering chamber and a heat treatment chamber, the cobalt film being deposited on a bare silicon surface of the main surface of the silicon wafer, wherein said depositing of the cobalt film is conducted at a temperature lower than a temperature at which a reaction layer of silicon and cobalt is formed on the interface between the bare silicon substrate surface and the cobalt film, the temperature, lower than the temperature at which said reaction layer is formed, being maintained until the end of depositing the cobalt film;
   (b) depositing, in a second sputtering chamber of the sputtering apparatus, an oxidation barrier film over the main surface of the silicon wafer having the cobalt film deposited thereover;
   (c) forming, in the second sputtering chamber, a silicide layer having dicobalt silicide ($Co_2Si$) as a main component over the interface between the silicon wafer and the cobalt film by a first-stage heat treatment in which the silicon wafer having the oxidation barrier film deposited thereover is heated;

(d) after the step (c), converting the main component of the silicide layer from dicobalt silicide to cobalt monosilicide (CoSi) by a second-stage heat treatment in which the silicon wafer is heated at a temperature higher than the temperature of the first-stage heat treatment;

(e) after the step (d), removing the oxidation barrier film and an unreacted portion of the cobalt film from the main surface of the silicon wafer; and (f) after the step (e), converting the main component of the silicide layer from the cobalt monosilicide to cobalt disilicide ($CoSi_2$) by a third-stage heat treatment in which the silicon wafer is heated at a temperature higher than the temperature of the second-stage heat treatment.

8. A fabrication method of a semiconductor integrated circuit device according to claim 7,
wherein the deposition temperature of the cobalt film in the step (a) is less than 200° C.

9. A fabrication method of a semiconductor integrated circuit device according to claim 8,
wherein the deposition temperature of the cobalt film in the step (a) is less than 100° C.

10. A fabrication method of a semiconductor integrated circuit device according to claim 9,
wherein the deposition temperature of the cobalt film in the step (a) is less than 50° C.

11. A fabrication method of a semiconductor integrated circuit device according to claim 7,
wherein the temperature of the first-stage heat treatment in the step (c) is equal to the deposition temperature of the oxidation barrier film in the step (b).

12. A fabrication method of a semiconductor integrated circuit device according to claim 7,
wherein the temperature of the first-stage heat treatment in the step (c) falls within a range of 200° C. or greater but less than 400° C.

13. A fabrication method of a semiconductor integrated circuit device according to claim 7,
wherein the temperature of the second-stage heat treatment in the step (d) falls within a range of 400° C. or greater but less than 700° C.

14. A fabrication method of a semiconductor integrated circuit device according to claim 7,
wherein the temperature of the third-stage heat treatment in the step (f) falls within a range of 700° C. or greater but less than 900° C.

15. A fabrication method of a semiconductor integrated circuit device according to claim 7,
wherein the deposition time of the cobalt film in the step (a) and the deposition time of the oxidation barrier film in the step (b) are each less than 15 seconds.

16. A fabrication method of a semiconductor integrated circuit device, comprising the steps of:

(a) forming a MISFET having a source and a drain made of a pair of semiconductor regions formed over the main surface of a silicon substrate, a gate insulating film formed over the main surface of the silicon substrate, and a gate electrode formed over the gate insulating film;

(b) depositing a cobalt film over the main surface of the silicon substrate having the MISFET formed thereover at a temperature lower than the temperature at which a reaction layer between silicon and cobalt is formed over the surface of the semiconductor regions constituting the source and drain, the cobalt film being deposited on a bare silicon surface of the main surface of the silicon substrate, said temperature, lower than the temperature at which said reaction layer is formed, being maintained until the end of depositing the cobalt film;

(c) depositing an oxidation barrier film over the cobalt film;

(d) forming a silicide layer having, as a main component, dicobalt silicide ($Co_2Si$) over the surface of the semiconductor regions constituting the source and drain by heat treating the silicon substrate having the cobalt film and oxidation barrier film deposited thereover at a first temperature;

(e) converting the main component of the silicide layer from dicobalt silicide to cobalt monosilicide (CoSi) by heat treating the silicon substrate at a second temperature higher than the first temperature;

(f) after the step (e), removing the oxidation barrier film and an unreacted portion of the cobalt film from the main surface of the silicon substrate; and (g) after the step (f), converting the main component of the silicide layer from cobalt monosilicide to cobalt disilicide ($CoSi_2$) by heat treating the silicon substrate at a third temperature higher than the second temperature.

17. A fabrication method of a semiconductor integrated circuit device according to claim 16,
wherein the deposition temperature of the cobalt film is less than 200° C.

18. A fabrication method of a semiconductor integrated circuit device according to claim 17,
wherein the first temperature falls within a range of 200° C. or greater but less than 400° C., the second temperature falls within a range of 400° C. or greater but less than 700° C., and the third temperature falls within a range of 700° C. or greater but less than 900° C.

19. A fabrication method of a semiconductor integrated circuit device according to claim 17,
wherein the deposition temperature of the cobalt film is less than 100° C.

20. A fabrication method of a semiconductor integrated circuit device according to claim 19,
wherein the deposition temperature of the cobalt film is less than 50° C.

21. A fabrication method of a semiconductor integrated circuit device according to claim 7, wherein said oxidation barrier film is made of a material selected from the group consisting of titanium nitride, tungsten nitride and tantalum nitride.

22. A fabrication method of a semiconductor integrated circuit device according to claim 7, wherein said oxidation barrier film is deposited at a surface temperature of the silicon wafer in a range of 200° C. or greater, but less than 400° C.

23. A fabrication method of a semiconductor integrated circuit device according to claim 1, wherein said second-stage heat treatment and said third-stage heat treatment are carried out in non-oxidizing atmospheres.

24. A fabrication method of a semiconductor integrated circuit device according to claim 1, wherein said first step is performed for 15 seconds or less.

25. A fabrication method of a semiconductor integrated circuit device according to claim 1, wherein in said first step the silicon substrate is cooled.

26. A fabrication method of a semiconductor integrated circuit device according to claim 1, wherein said temperature at which the cobalt film is deposited is a temperature lower than that at which a reaction layer of any cobalt silicide is formed.

27. A fabrication method of a semiconductor integrated circuit device according to claim 7, wherein said temperature at which the cobalt film is deposited is a temperature lower than that at which a reaction layer of any cobalt silicide is formed.

28. A fabrication method of a semiconductor integrated circuit device according to claim 16, wherein said temperature at which the cobalt film is deposited is a temperature lower than that at which a reaction layer of any cobalt silicide is formed.

29. A fabrication method of a semiconductor integrated circuit device according to claim 1, wherein in the first step the silicon substrate is held by an electrostatic chuck which dissipates heat from the silicon substrate.

30. A fabrication method of a semiconductor integrated circuit device, comprising:
   a first step of depositing a cobalt film over the main surface of a silicon substrate, the cobalt film being deposited on a bare silicon surface of the main surface of the silicon substrate, wherein in said first step the silicon substrate is cooled; and
   a second step of heat treating the silicon substrate to form a silicide layer on the interface between the silicon substrate and the cobalt film,
   wherein in the first step, the cobalt film is deposited at a temperature lower than a temperature at which a reaction layer of silicon and cobalt is formed on the interface between the bare silicon substrate surface and the cobalt film, said temperature, lower than the temperature at which said reaction layer is formed, being maintained until the end of depositing the cobalt film.

31. A fabrication method of a semiconductor integrated circuit device, comprising:
   a first step of depositing a cobalt film over the main surface of a silicon substrate, the cobalt film being deposited on a bare silicon surface of the main surface of the silicon substrate, wherein in said first step the silicon substrate is held by an electrostatic chuck which dissipates heat from the silicon substrate; and
   a second step of heat treating the silicon substrate to form a silicide layer on the interface between the silicon substrate and the cobalt film,
   wherein in the first step, the cobalt film is deposited at a temperature lower than a temperature at which a reaction layer of silicon and cobalt is formed on the interface between the bare silicon substrate surface and the cobalt film, said temperature, lower than the temperature at which said reaction layer is formed, being maintained until the end of depositing the cobalt film.

* * * * *